(12) United States Patent
Bardouillet et al.

(10) Patent No.: US 7,084,480 B2
(45) Date of Patent: Aug. 1, 2006

(54) RESISTIVE POLYSILICON ELEMENT CONTROLLABLE TO IRREVERSIBLY DECREASE ITS VALUE

(75) Inventors: Michel Bardouillet, Rousset (FR); Alexandre Malherbe, Trets (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/694,158

(22) Filed: Oct. 27, 2003

(65) Prior Publication Data

US 2004/0085182 A1    May 6, 2004

(51) Int. Cl.
*H01L 29/00* (2006.01)

(52) U.S. Cl. .......................... 257/529; 257/30

(58) Field of Classification Search ................ 257/529, 257/312, 566, 595, 538, 50, 530; 365/100, 365/189.03
See application file for complete search history.

(56) References Cited

U.S. PATENT DOCUMENTS

| | | | |
|---|---|---|---|
| 4,146,902 A | 3/1979 | Tanimoto et al. | |
| 4,399,372 A | 8/1983 | Tanimoto et al. | |
| 4,559,637 A | 12/1985 | Weber | |
| 4,586,163 A | 4/1986 | Koike | |
| 4,698,589 A | 10/1987 | Blankenship et al. | |
| 5,187,559 A | 2/1993 | Isobe et al. | |
| 5,384,740 A * | 1/1995 | Etoh et al. ............. | 365/189.09 |
| 5,418,738 A | 5/1995 | Abadeer et al. | |
| 5,638,029 A * | 6/1997 | O'Shaughnessy ............ | 331/44 |
| 6,433,725 B1 | 8/2002 | Chen et al. | |
| 6,441,679 B1 * | 8/2002 | Ohshima ..................... | 327/538 |
| 6,583,652 B1 * | 6/2003 | Klein et al. ................. | 327/103 |
| 6,794,707 B1 * | 9/2004 | Cao ........................... | 257/312 |
| 2002/0027793 A1 | 3/2002 | Johnson et al. | |

FOREIGN PATENT DOCUMENTS

| | | |
|---|---|---|
| DE | 198 39 141 A1 | 3/2000 |
| DE | 101 01 575 A1 | 7/2002 |

OTHER PUBLICATIONS

French Search Report from French Patent Application No. 02/13458, filed Oct. 28, 2002.
French Search Report from French Patent Application No. 02/13457, filed Oct. 28, 2002.
French Search Report from French Patent Application No. 02/13694, filed Oct. 31, 2002.
Kato K. et al. "A Physical Mechanism of Current-Induced Resistance Decrease In Heavily Doped Polysilicon Resistors" IEEE Transactions on Electron Devices, IEEE Inc. New York, US, vol. 29, No. 8, Aug. 1982, pp. 1156-1161.

* cited by examiner

*Primary Examiner*—Howard Weiss
*Assistant Examiner*—(Vikki) Hoa B. Trinh
(74) *Attorney, Agent, or Firm*—Lisa K. Jorgenson; James H. Morris; Wolf, Greenfield & Sacks, P.C.

(57) ABSTRACT

A resistive element controllable to irreversibly decrease its value, including several polysilicon resistors connected in series between two input/output terminals of the resistive lemen; and an assembly of switches, connected to turn the series connection into a parallel association of said resistors between two programming terminals intended to receive a supply voltage.

19 Claims, 3 Drawing Sheets

RESISTIVE POLYSILICON ELEMENT CONTROLLABLE TO IRREVERSIBLY DECREASE ITS VALUE

BACKGROUND OF THE INVENTION

1. Field of the Invention

The present invention relates to integrated resistors. It more specifically relates to resistors made of polysilicon in an integrated circuit.

2. Discussion of the Related Art

FIG. 1 shows in a very simplified partial perspective view an example of a polysilicon resistor of the type to which the present invention applies.

Such a resistor 1 is formed of a polysilicon track (also called a bar) obtained by etching a layer deposited on an insulating substrate 2. Substrate 2 is indifferently formed of the integrated circuit substrate or is formed of an insulating layer forming an insulating substrate or the like for resistor 1. Resistor 1 is connected, by its two ends, to conductive tracks (for example, metal tracks) 3 and 4 intended to connect the resistive bar to the other integrated circuit elements according to the application. The simplified representation of FIG. 1 makes no reference to the different insulating and conductive layers generally forming the integrated circuit. To simplify, only resistive bar 1 laid on insulating substrate 2 and in contact, by the ends of its upper surface, with the two metal tracks 3 and 4, has been shown. In practice, the connections of resistive element 1 to the other integrated circuit components are obtained by wider polysilicon tracks starting from the ends of bar 1 in the alignment thereof. In other words, resistive element 1 is generally formed by making a section of a polysilicon track narrower than the rest of the track.

Resistance R of element 1 is given by the following formula:

$$R = \rho(L/s),$$

where $\rho$ designates the resistivity of the material (polysilicon, possibly doped) forming the track in which element 1 is etched, where L designates the length of element 1, and where s designates its section, that is, its width 1 multiplied by its thickness e. Resistivity $\rho$ of element 1 depends, among others, on the possible doping of the polysilicon forming it. In certain cases, the polysilicon element is covered with a metal layer, the resistive element then combining the polysilicon and the overlying metal.

Most often, upon forming of an integrated circuit, the resistors are provided by referring to a notion of so-called square resistance $R_\square$. This square resistance defines as being the resistivity of the material divided by the thickness with which it is deposited. Taking the above relation giving the resistance of an element 1, the resistance is thus given by the following relation:

$$R = R_\square * L/1.$$

Quotient L/1 corresponds to what is called the number of squares forming resistive element 1. This represents, as seen from above, the number of squares of given dimension depending on the technology put side by side to form element 1.

The value of the polysilicon resistor is thus defined, upon manufacturing, based on the above parameters, resulting in so-called nominal resistivities and resistances. Generally, thickness e of the polysilicon is set by other manufacturing parameters of the integrated circuit. For example, this thickness is set by the thickness desired for the gates of the integrated circuit MOS transistors.

In recent technologies, the use of polysilicon resistors is limited to resistors meant to conduct, in operation, currents smaller than 100 µA. For greater currents, a diffusion resistor is generally used. Polysilicon is however preferred to a dopant diffusion, since the occurrence of stray capacitances with the substrate is avoided.

To irreversibly decrease the value of a polysilicon resistor, a so-called constraint current is temporarily imposed, for which the resistance crosses a maximum value, this current being beyond the normal operating current range of this resistance. In other words, the polysilicon resistivity in the operating current range is decreased, in stable and irreversible fashion, by imposing in the corresponding resistive element the flowing of a current beyond the operating current range.

The current used to decrease the resistance is, conversely to a fusible element, non-destructive for the polysilicon element.

FIG. 2 illustrates, with a curve network giving the resistance of a polysilicon element of the type shown in FIG. 1 according to the current flowing therethrough, the way of decreasing the resistance of this element.

It is assumed that the polysilicon having been used to manufacture resistive element 1 exhibits a nominal resistivity giving element 1, for the given dimensions 1, L, and e, a resistance $R_{nom}$. This nominal (original) value of the resistance corresponds to the value taken in a stable manner by resistive element 1 in the operating current range of the system, that is, generally, for currents smaller than 100 µA.

To decrease the resistance and to switch in an irreversible and stable manner, for example, to a value R1 smaller than $R_{nom}$, a so-called constraint current (for example, I1), greater than a current Im for which the value of resistance R of element 1 is maximum without for all this being infinite, is imposed across resistive element 1. As illustrated in FIG. 2, once current I1 has been applied to resistive element 1, a stable resistance of value R1 is obtained in range A1 of operating currents of the integrated circuit. In fact, curve $S_{nom}$ of the resistance according to the current is stable for relatively low currents (smaller than 100 µA). This curve starts increasing for substantially higher currents on the order of a few milliamperes, or even more (range A2). In this current range, curve $S_{nom}$ crosses a maximum for value Im. The resistance then progressively decreases. In FIG. 2, a third range A3 of currents corresponding to the range generally used to make fuses has been illustrated. These are currents on the order of one tenth of an ampere where the resistance starts abruptly increasing to become infinite. Accordingly, it can be considered that the present invention uses intermediary range A2 of currents between operating range A1 and destructive range A3, to irreversibly decrease the resistance or more specifically the resistivity of the polysilicon element.

Indeed, once the maximum of curve Snom of the resistivity according to the current has been passed, the value taken by the resistance in the operating current range is smaller than value $R_{nom}$. The new value, for example, R1, depends on the higher value of the current (here, I1) which has been applied during the irreversible current phase. It should indeed be noted that the irreversible decrease performed by the present invention occurs in a specific programming phase, outside of the normal read operating mode (range A1) of the integrated circuit, that is, outside of the normal resistor operation.

Once the value of the polysilicon resistor has been lowered to a lower value (for example, R1 in FIG. 2), an irreversible decrease in this value may further be implemented. It is enough, to achieve this, to exceed maximum current I1 of the new curve S1 of the resistance according to the current. For example, the current value may be increased to reach a value 12. When the current is then decreased again, a value R2 is obtained for the resistor in its normal operating range. The value of R2 is smaller than value R1 and, of course, than value $R_{nom}$.

It can be seen that all the curves of the resistance according to the current join on the decrease slope of the resistance value, after having crossed the maximum of the curve. Thus, for a given resistive element (ρ, L, s), currents I1, I2, etc. which must be reached, to switch to a smaller resistance value, are independent from the value of the resistance ($R_{nom}$, R1, R2) from which the decrease is caused.

What has been expressed hereabove as the resistance value actually corresponds to a decrease in the resistivity of the polysilicon forming the resistive element. The present inventors consider that the crystalline polysilicon structure is modified in a stable manner and that, in a way, the material is reflowed, the obtained final crystalline structure depending on the maximum current reached. In fact, the constraint current causes a temperature rise of the silicon element, which causes its flowing.

Of course, it will be ascertained not to exceed programming current range A2 (on the order of a few milliamperes) to avoid destroying the polysilicon resistor. This precaution will pose no problem in practice since the use of polysilicon to form a fuse requires much higher currents (on the order of one tenth of an ampere) which are not available once the circuit has been made.

The practical forming of a polysilicon resistor according to the present invention does not differ from the forming of a conventional resistor. Starting from an insulating substrate, a polysilicon layer is deposited and etched according to the dimensions desired for the resistor. Since the deposited polysilicon thickness is generally determined by technology, the two dimensions which can be adjusted are the width and the length. Generally, an insulator is redeposited on the polysilicon bar thus obtained. In the case of an on-line interconnection, width 1 will have been modified with respect to the wider access tracks to be more strongly conductive. In the case of an access to the ends of the bar from the top as shown in FIG. 1, vias will be made in the overlying insulator (not shown) of the polysilicon bar to connect contact metal tracks 3 and 4.

In practice, to have the highest resistance adjustment capacity with a minimum constraint current, a minimum thickness and a minimum width will be desired to be used for the resistive elements. In this case, only length L conditions the nominal value of the resistance once the polysilicon structure has been set. The possible polysilicon doping, whatever its type, does not hinder the implementation of the present invention. The only difference linked to the doping is the nominal resistivity before constraint and the resistivities obtained for given constraint currents. In other words, for an element of given dimensions, this conditions the starting point of the resistance value, and accordingly the resistance values obtained for given constraint currents.

To switch from the nominal value to a lower resistance or resistivity value, several methods may be used according to the present invention.

For example, the current is progressively (step by step) increased in the resistor. After each application of a higher current, it is returned to the operating current range and the resistance value is measured. As long as current point Im has not been reached, this resistance value will remain at value $R_{nom}$. As soon as current point Im has been exceeded, there is a curve change (curve S) and the measured value when back to the operating currents becomes a value smaller than value $R_{nom}$. If this new value is satisfactory, the process ends here. If not, higher currents are reapplied to exceed the new maximum value of the current curve. In this case, it is not necessary to start from the minimum currents again as when starting from the nominal resistance. Indeed, the value of the current for which the resistance will decrease again is necessarily greater than the value of constraint current I1 applied to pass onto the current curve. The determination of the pitch to be applied is within the abilities of those skilled in the art and is not critical in that it essentially conditions the number of possible decreases. The higher the pitch, the higher the jumps between values will be.

According to another preferred example, the different currents to be applied to pass from the different resistance values to smaller values are predetermined, for example, by measurements. This predetermination of course takes into account the nature of the polysilicon used as well as, preferentially, the square resistance, that is, the resistivity of the material and the thickness with which it is deposited. Indeed, since the curves illustrated by FIG. 2 may also be read as the curves of the square resistance, the calculated values may be transposed to the different resistors of an integrated circuit defined by the widths and lengths of the resistive sections. According to this second embodiment, the value of the constraint current to be applied to the resistive element to decrease its value in an irreversible and stable manner can then be predetermined.

The curve change, that is, the decrease in the resistance value in normal operation is almost immediate as soon as the corresponding constraint current is applied. "Almost immediate" means a duration of a few tens or even hundreds of microseconds which are sufficient to apply the corresponding constraint to the polysilicon bar and decrease the value of its resistance. This empirical value depends on the (physical) size of the bar. A duration of a few milliseconds may be chosen for security. Further, it can be considered that, once the minimum duration has been reached, no additional duration of application of the constraint current modifies, at least at the first order, the obtained resistance. Moreover, even if in a specific application, it is considered that the influence of the duration of application of the constraint cannot be neglected, the two methods are perfectly compatible with the taking into account of the duration of application of the constraint.

SUMMARY OF THE INVENTION

The present invention aims at providing an integrated polysilicon resistive element programmable to irreversibly decrease the value of the resistance, with respect to its original value (nominal value after manufacturing).

The present invention more specifically aims at providing a solution which does not require applying across the resistive element, to apply a constraint current, a voltage greater than the operating voltage of this element.

To achieve these and other objects, the present invention provides a resistive element controllable to irreversibly decrease its value, comprising:

several polysilicon resistors connected in series between two input/output terminals of the resistive element; and an assembly of switches, connected to turn the series connection into a parallel association of said resistors between two programming terminals intended to receive a supply voltage.

According to an embodiment of the present invention, said switch assembly comprises one more switch than the resistive element comprises resistors, one of the switches connecting one of said input/output terminals to one of said programming terminals.

According to an embodiment of the present invention, said switches are formed of MOS transistors with a number of N-channel transistors greater by one than the number of P-channel transistors.

According to an embodiment of the present invention, said switch assembly comprises as many switches as the resistive element comprises resistors, one of said input/output terminals being confounded with one of said programming resistors.

According to an embodiment of the present invention, said switches are formed of MOS transistors distributed half and half between P-channel transistors and N-channel transistors.

According to an embodiment of the present invention, each interconnection point between two resistors is connected to a first terminal of a switch of the assembly, the second terminal of which is connected to one of said programming terminals.

According to an embodiment of the present invention, each the resistors has an identical nominal value.

According to an embodiment of the present invention, said programming is performed by imposing in each of the resistors a constraint current greater than a current for which the value of this resistance exhibits a maximum.

According to an embodiment of the present invention, said constraint current stands beyond an operating current range of the resistive element when the resistors are in series.

The foregoing objects, features, and advantages of the present invention will be discussed in detail in the following non-limiting description of specific embodiments in connection with the accompanying drawings.

DETAILED DESCRIPTION

Figure 1:
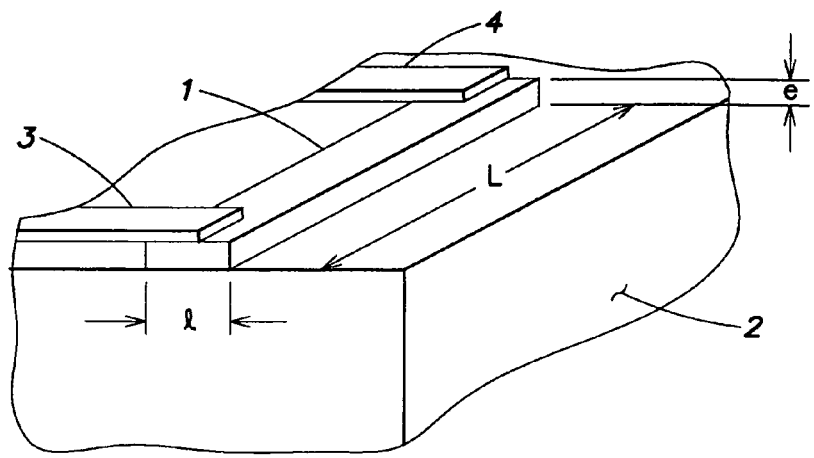
FIG. 1, previously described, partially and very schematically shows an example of a resistive polysilicon element of the type to which the present invention applies.
Figure 2:
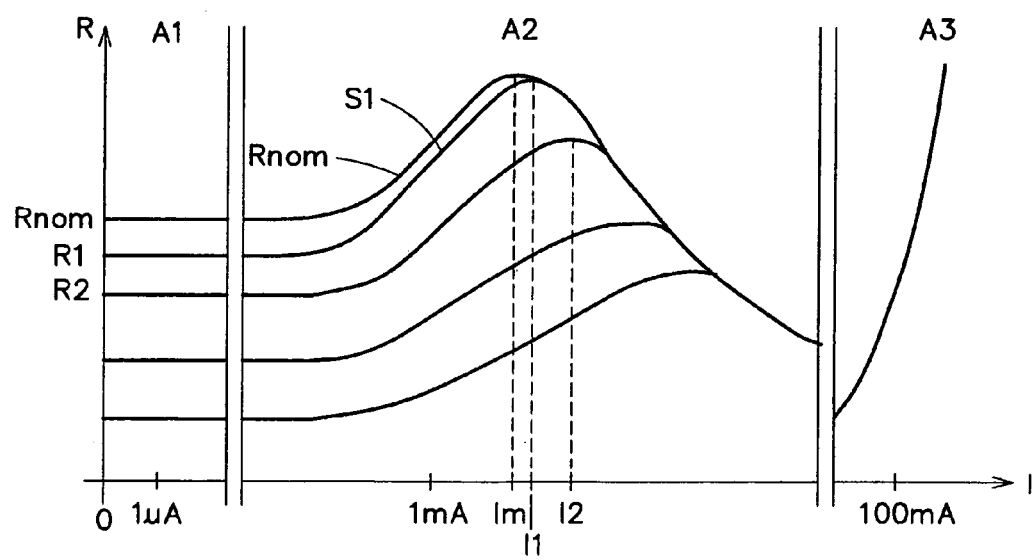
FIG. 2, previously described, illustrates, in a curve network representing the value of the resistance versus the current in a polysilicon element, the implementation of the method of irreversible decrease of the value of a resistor according to the present invention.

The same elements have been designated with the same reference numerals in the different drawings. For clarity, only those method steps and those elements of the device that are necessary to the understanding of the present invention have been shown in the drawings and will be described hereafter. In particular, the practical forming of resistive polysilicon sections by deposition and etch has not been detailed, the present invention being implementable by conventional manufacturing techniques.

Figure 3:
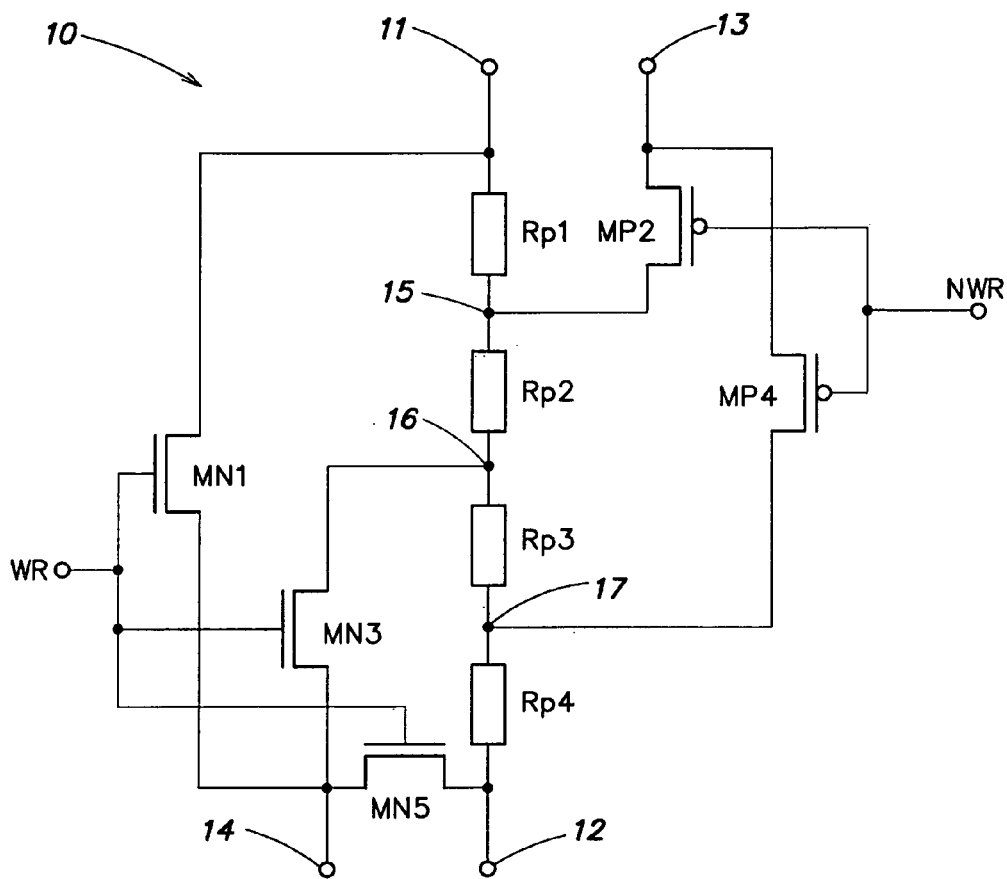
FIG. 3 shows a first embodiment of a resistive element controllable to irreversibly decrease its value according to the present invention.

FIG. 3 shows an embodiment of a resistive element according to the present invention.

This element 10 is formed of a series association of, for example, four resistors Rp1 to Rp4 each formed of a polysilicon section such as illustrated in FIG. 1. Resistors Rp1 to Rp4 are series-associated between two input/output terminals 11 and 12 of resistive element 10. The value of the resistive element thus corresponds to the sum of the individual values of resistors Rp1 and Rp4.

To ensure the programming of resistive element 10, it is provided to transform the series association of resistors Rp1 to Rp4 between terminals 11 and 12 into a parallel association of these resistors between terminals 13 and 14 between which a supply voltage will be applied. The fact of placing these resistors in parallel enables that by applying a supply voltage identical to the voltage applied for the normal operation, the current in each of the resistors is much higher. In the example of four resistors of identical nominal values, this current is multiplied by four for a same supply voltage as that which would be applied between terminals 11 and 12 in the series association.

Figure 4A:
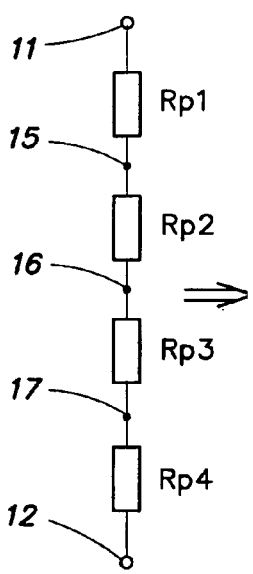
FIGS. 4A and 4B illustrate the operation of the resistive element of FIG. 3.
Figure 4B:
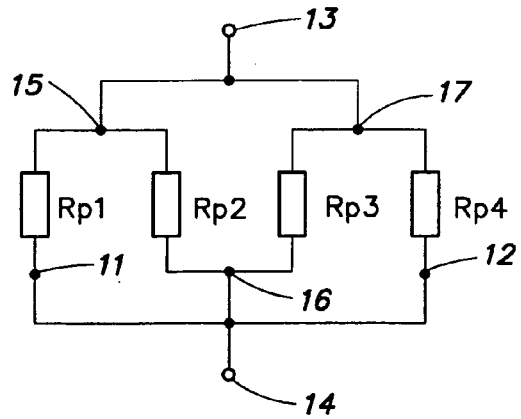

This operation will be illustrated in FIGS. 4A and 4B which respectively show the resistive element of the present invention upon normal operation and in a programming of its value. In FIG. 4A, resistors Rp1 to Rp4 are in series between terminals 11 and 12 while in FIG. 4B, these same resistors are in parallel between terminals 13 and 14.

One of the terminals (for example, 12) of the series association may be confounded with one of the terminals (for example, 14) of the parallel association, especially if resistor 10 is directly connected to a supply terminal in its application environment (in series). However, the present invention will be described by taking as an example a more general case (and in practice, more frequent) where the terminals of the series association are separate from the terminals of the parallel association.

In the example of FIG. 3, the series-to-parallel configuration change is obtained by means of five switches (for example, MOS transistors). A first MOS transistor MN1 connects terminal 11 to terminal 14. A first P-channel transistor MP2 connects junction point 15 of resistors Rp1 and Rp2 to terminal 13. A third N-channel transistor MN3 connects junction point 16 of resistors Rp2 and Rp3 to terminal 14. A fourth P-channel transistor MP4 connects junction point 17 of resistors Rp3 and Rp4 to terminal 13. Finally, a fifth N-channel transistor MN5 connects terminals 12 and 14.

The respective gates of transistors MN1, MN3, and MN5 receive a signal WR active in the high state to set points 11, 16, and 12 to the voltage of terminal 14. Transistors MP2 and MP4 are controlled by a reverse signal NWR active in the low state to place points 15 and 17 to the voltage of terminal 13. These connections are of course performed by neglecting the voltage drops in the on-state switches.

An advantage of the present invention is that it requires no programming voltage greater than the voltages available for the operating circuit to program the resistive element to irreversibly decrease its value. It is in particular not necessary to size programming switches to hold voltages greater than the normal operating voltages.

Of course, other connection schemes may be provided. For example, three P-channel transistors and two N-channel transistors may be used. However, minimizing the number of P-channel transistors is preferable for bulk reasons. Further, the end terminals connected to each other by a transistor may be terminals 11 and 13 instead of terminals 12 and 14, points 15 and 17 being then connectable to terminal 14 and points 16 and 12 being connectable to terminal 13.

Figure 5:
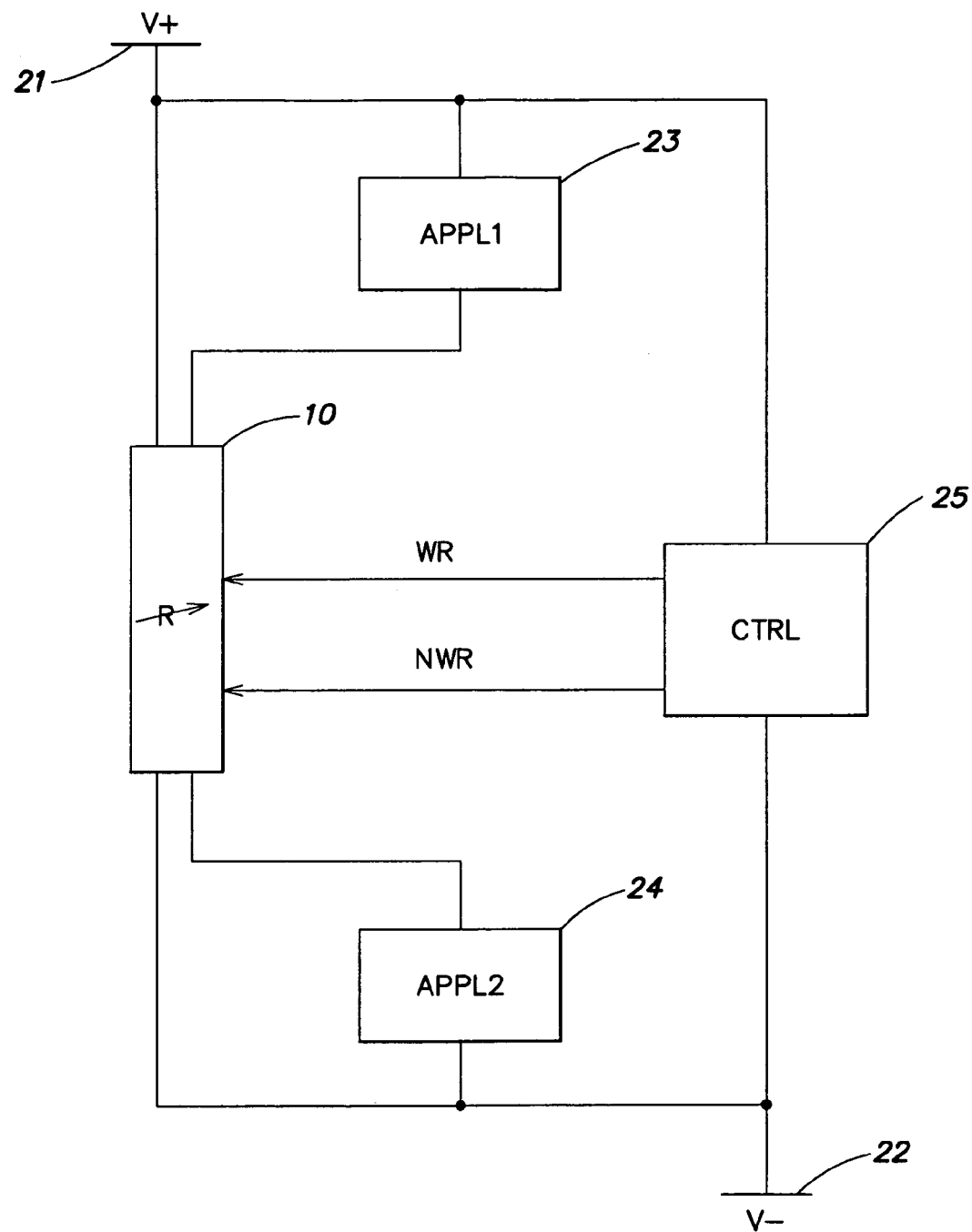
FIG. 5 shows an example of application of a resistive element according to the present invention to the forming of a memory cell.

FIG. 5 very schematically shows a resistive element 10 such as shown in FIG. 3 in an applicative environment. Assume a supply voltage applied between terminals 21 and 22 at potentials V+ and V−. In normal operation, resistive element 10 is connected, for example, in series, between two loads 23 (APPL1) and 24 (APPL2) representing any application, between terminals 21 and 22. Optionally, a single load 23 or 24 is actually connected, for example, if resistor 10 is directly connected to one of supply terminals 21 and 22. A control circuit 25 (CTRL) is supplied with the voltage (V+, V−). Circuit 25 generates signals WR and NWR for resistive element 10 to place it, on request, in a programming configuration.

As an alternative, the resistive element may of course be connected in a parallel assembly, the adaptation being within the abilities of those skilled in the art based on the functional indications given in relation with FIG. 5.

An example of application of the present invention concerns the forming of a memory cell programmable only once by irreversible decrease in the resistance value. Such a memory cell then comprises a resistive element 10 according to the present invention appropriately connected to be read by either an amplifier associated with a voltage reference, or a differential structure. Resistive element 10 of the present invention then connects like a resistive element used as a fuse.

Preferably, the polysilicon forming the resistive elements of the present invention is not submitted to a metal deposition conventionally used to decrease the resistance of MOS transistor gates.

Of course, the present invention is likely to have various alterations, modifications, and improvements which will readily occur to those skilled in the art. In particular, the sizing of the polysilicon resistors to obtain a nominal value depends on the application and is within the abilities of those skilled in the art based on the functional indications given hereabove.

Further, other applications and control circuits than those discussed hereabove as an example may be considered. In particular, the control of the decrease in the resistance value performed according to the present invention may be voluntary or automated according to applications.

Further, the number of controllable resistors usable in an integrated circuit is not limited. They may even, if desired, share a same control circuit. The number of switches is at least equal to the number of resistors and preferably corresponds to the number of resistors plus one.

Although the control circuit is preferentially integrated with the resistor, which especially eases the method implementation during the resistor lifetime, it is not excluded to use a separate circuit to force the constraint current in the resistor. On this regard, the voltage or current constraint values to implement the present invention are within the abilities of those skilled in the art based on the functional indications given hereabove.

Finally, the even or odd number of programmable resistors associated in series to form an element according to the present invention may be any number. The higher this number, the greater the constraint current applied in a programming phase will be for a same supply voltage.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A resistive element controllable to irreversibly decrease its value, comprising:
several polysilicon resistors connected in series between two input/output terminals of the resistive element; and
an assembly of switches, connected to turn the series connection into a parallel association of said resistors between two programming terminals, the two programming terminals being different from said input/output terminals, the two programming terminals intended to receive a supply voltage.

2. The resistive element of claim 1, wherein said switch assembly comprises one more switch than the resistive element comprises resistors, one of the switches connecting one of said input/output terminals to one of said programming terminals.

3. The resistive element of claim 2, wherein said switches comprise MOS transistors with a number of N-channel transistors greater by one than the number of P-channel transistors.

4. The resistive element of claim 1, wherein said switch assembly comprises as many switches as the resistive element comprises resistors, one of said input/output terminals being the same as one of said programming resistors.

5. The resistive element of claim 4, wherein said switches are formed of MOS transistors distributed half and half between P-channel transistors and N-channel transistors.

6. The resistive element of claim 1, wherein each interconnection between two resistors is connected to a first terminal of a switch of the assembly, the second terminal of which is connected to one of said programming terminals.

7. The resistive element of claim 1, wherein each of the resistors has an identical nominal value.

8. The resistive element of claim 1, wherein said programming is performed by imposing in each of the resistors a constraint current greater than a current for which the value of this resistance exhibits a maximum.

9. The resistive element of claim 8, wherein said constraint current stands beyond an operating current range of the resistive element when the resistors are in series.

10. A resistive element controllable to irreversibly decrease its value, comprising:
several polysilicon resistors connected in series between two input/output terminals of the resistive element;
an assembly of switches, connected to turn the series connection into a parallel association of said resistors between two programming terminals intended to receive a supply voltage;
wherein the assembly of switches comprises one more switch than the resistive element comprises resistors, one of the switches connecting one of said input/output terminals to one of said programming terminals; and
wherein the assembly of switches further comprises MOS transistors with a number of N-channel transistors greater by one than the number of P-channel transistors.

11. The resistive element of claim 10, wherein each interconnection point between two resistors is connected to a first terminal of a switch of the assembly, the second terminal of which is connected to one of said programming terminals.

12. The resistive element of claim 10, wherein each of the resistors has an identical nominal value.

13. The resistive element of claim 10, wherein said programming is performed by imposing in each of the resistors a constraint current greater than a current for which the value of this resistance exhibits a maximum.

14. The resistive element of claim 13, wherein said constraint current stands beyond an operating current range of the resistive element when the resistors are in series.

15. A resistive element controllable to irreversibly decrease its value, comprising:
   several polysilicon resistors connected in series between two input/output terminals of the resistive element;
   an assembly of switches, connected to turn the series connection into a parallel association of said resistors between two programming terminals intended to receive a supply voltage;
   wherein said switch assembly comprises as many switches as the resistive element comprises resistors, one of said input/output terminals being the same as one of said programming resistors; and
   wherein said switches are formed of MOS transistors distributed half and half between P-channel transistors and N-channel transistors.

16. The resistive element of claim 15, wherein each interconnection point between two resistors is connected to a first terminal of a switch of the assembly, the second terminal of which is connected to one of said programming terminals.

17. The resistive element of claim 15, wherein each of the resistors has an identical nominal value.

18. The resistive element of claim 15, wherein said programming is performed by imposing in each of the resistors a constraint current greater than a current for which the value of this resistance exhibits a maximum.

19. The resistive element of claim 18, wherein said constraint current stands beyond an operating current range of the resistive element when the resistors are in series.

* * * * *

UNITED STATES PATENT AND TRADEMARK OFFICE
CERTIFICATE OF CORRECTION

| | | |
|---|---|---|
| PATENT NO. | : 7,084,480 B2 | Page 1 of 1 |
| APPLICATION NO. | : 10/694158 | |
| DATED | : August 1, 2006 | |
| INVENTOR(S) | : Michel Bardouillet et al. | |

It is certified that error appears in the above-identified patent and that said Letters Patent is hereby corrected as shown below:

On the title page, item (30) should read:
(30)   Foreign Application Priority Data
Oct. 31, 2002   (FR)......................02 13690

Title Page
In the Abstract, line 4 should read:
--element; and an assembly of switches, connected to turn the--

Signed and Sealed this

Twenty-first Day of November, 2006

JON W. DUDAS
*Director of the United States Patent and Trademark Office*